(12) United States Patent
Itoh (10) Patent No.: US 11,251,101 B2
(45) Date of Patent: Feb. 15, 2022

(54) SEMICONDUCTOR DEVICE

(71) Applicant: FUJI ELECTRIC CO., LTD., Kawasaki (JP)

(72) Inventor: Taichi Itoh, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/800,681

(22) Filed: Feb. 25, 2020

(65) Prior Publication Data

US 2020/0194329 A1 Jun. 18, 2020

Related U.S. Application Data

(63) Continuation of application No. PCT/CN2018/107628, filed on Sep. 26, 2018.

(30) Foreign Application Priority Data

Mar. 20, 2018 (JP) .............................. JP2018-052939

(51) Int. Cl.
| | |
|---|---|
| *H01L 23/36* | (2006.01) |
| *H01L 23/48* | (2006.01) |
| *H01L 23/055* | (2006.01) |
| *H01L 25/07* | (2006.01) |

(Continued)

(52) U.S. Cl.
CPC ............ *H01L 23/36* (2013.01); *H01L 23/055* (2013.01); *H01L 23/48* (2013.01); *H01L 25/072* (2013.01); *H01L 25/18* (2013.01); *H05K 1/142* (2013.01)

(58) Field of Classification Search
CPC ....... H01L 23/36; H01L 23/055; H01L 23/48; H01L 25/072; H01L 25/18; H05K 1/142
See application file for complete search history.

(56) References Cited

U.S. PATENT DOCUMENTS 5,621,243 A * 4/1997 Baba ................... H01L 23/3735
257/712
6,236,110 B1 5/2001 Muto et al.
(Continued)

FOREIGN PATENT DOCUMENTS

| AT | 14114 U1 | 4/2015 |
|---|---|---|
| CN | 105789192 A | 7/2016 |

(Continued)

OTHER PUBLICATIONS

International Search Report for PCT/JP2019/002611, dated Apr. 2, 2019.

(Continued)

*Primary Examiner* — Peniel M Gumedzoe
(74) *Attorney, Agent, or Firm* — Rabin & Berdo, P.C.

(57) ABSTRACT

A main ceramic circuit board on which a semiconductor element is arranged is separate from a sub-ceramic circuit board on which a connection terminal is arranged. Accordingly, heat generated by the semiconductor element is conducted via the main ceramic circuit board and a base plate (Continued)

arranged thereunder and the sub-ceramic circuit board to the connection terminal. That is to say, it is difficult to conduct heat from the semiconductor element to the connection terminal, compared with a case where the connection terminal and the semiconductor element are arranged over the same ceramic circuit board.

7 Claims, 4 Drawing Sheets

(51) Int. Cl.
*H01L 25/18* (2006.01)
*H05K 1/14* (2006.01)

(56) References Cited

U.S. PATENT DOCUMENTS

| | | | |
|---|---|---|---|
| 6,700,073 B2 * | 3/2004 | Hiramatsu | H01L 23/24 |
| | | | 174/258 |
| 7,910,952 B2 | 3/2011 | Tschirbs et al. | |
| 10,186,607 B2 | 1/2019 | Hatori et al. | |
| 2001/0014029 A1 | 8/2001 | Suzuki et al. | |
| 2007/0205500 A1 | 9/2007 | Nuebel et al. | |
| 2014/0210067 A1 | 7/2014 | Takamiya et al. | |
| 2014/0218991 A1 | 8/2014 | Chen et al. | |
| 2015/0097281 A1 | 4/2015 | Adachi | |
| 2015/0270786 A1 | 9/2015 | Chen et al. | |
| 2018/0204778 A1 | 7/2018 | Hasegawa et al. | |

FOREIGN PATENT DOCUMENTS

| | | |
|---|---|---|
| DE | 60028282 T2 | 11/2006 |
| DE | 102006045939 A1 | 4/2008 |
| DE | 112014006786 T5 | 3/2017 |
| DE | 112015006984 T5 | 7/2018 |
| JP | S50-3095 Y2 | 1/1975 |
| JP | H07202088 A | 8/1995 |
| JP | H08-213547 A | 8/1996 |
| JP | H09-181219 A | 7/1997 |
| JP | 2001-308246 A | 11/2001 |
| JP | 2009-021345 A | 1/2009 |
| JP | 4759716 B2 | 8/2011 |
| JP | 2014-155287 A | 8/2014 |
| JP | 2017-118816 A | 6/2017 |
| WO | 2013/047101 A1 | 4/2013 |
| WO | 2017/056176 A1 | 4/2017 |

OTHER PUBLICATIONS

Written Opinion for PCT/JP2019/002611, dated Apr. 2, 2019.
Second Office Action dated Sep. 16, 2021 for the corresponding DE patent application No. 11 2019 000 176.0.

* cited by examiner

SEMICONDUCTOR DEVICE

CROSS-REFERENCE TO RELATED APPLICATION

This application is a continuation application of International Application PCT/JP2019/002611 filed on Jan. 28, 2019 which designated the U.S., which claims priority to Japanese Patent Application No. 2018-052939, filed on Mar. 20, 2018, the entire contents of which are incorporated herein by reference.

BACKGROUND OF THE INVENTION

1. Field of the Invention

The embodiments discussed herein are related to a semiconductor device.

2. Background of the Related Art

For example, a semiconductor device includes a plurality of power semiconductor elements used as power conversion elements of an inverter unit. A power semiconductor element is a metal oxide semiconductor field effect transistor (MOSFET), an insulated gate bipolar transistor (IGBT), a freewheeling diode (FWD), or the like. Furthermore, a power semiconductor element is a reverse conducting (RC)-IGBT obtained by integrating an IGBT and an FWD, a reverse blocking (RB)-IGBT having a sufficient breakdown voltage against a reverse bias, or the like.

Such a power semiconductor device includes a semiconductor element, a lead frame (connection terminals), a ceramic circuit board to which the semiconductor element and the lead frame are connected via solder, and a base plate over which the ceramic circuit board is arranged. The semiconductor element is electrically connected to the connection terminals. In particular, the ceramic circuit board over the base plate is divided into a plurality of parts. This disperses a warp of the base plate and prevents breakage of the ceramic circuit board (see, for example, Japanese Laid-open Patent Publication No. 09-181219).

By the way, with a semiconductor device in which a semiconductor element and connection terminals are arranged over the same ceramic circuit board, heat generated by the semiconductor element as a result of driving may be conducted via the ceramic circuit board to the connection terminals. The connection terminals are connected to external devices, such as a control circuit board and a power supply unit, according to their functions. If the connection terminals are heated, then the external devices, such as the control circuit board and the power supply unit, are also heated. This may induce a malfunction.

SUMMARY OF THE INVENTION

According to an aspect, there is provided a semiconductor device including a semiconductor element, a connection terminal, a base plate having in a plan view a rectangular shape with two long sides and two short sides, a main substrate on which the semiconductor element is disposed, the main substrate being disposed on a front surface of the base plate, and a sub-substrate on which the connection terminal is disposed, the main substrate being disposed on the front surface of the base plate. The main substrate is disposed in an arrangement area of the front surface of the base plate, the arrangement area being located between the two long sides of the base plate and including a center of the front surface of the base plate, and the sub-substrate is disposed on the front surface at a periphery of the base plate between one of the two long sides of the base plate and the arrangement area so as to be positioned closer to the one of the two long sides than is the arrangement area.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

First Embodiment

Figure 1:
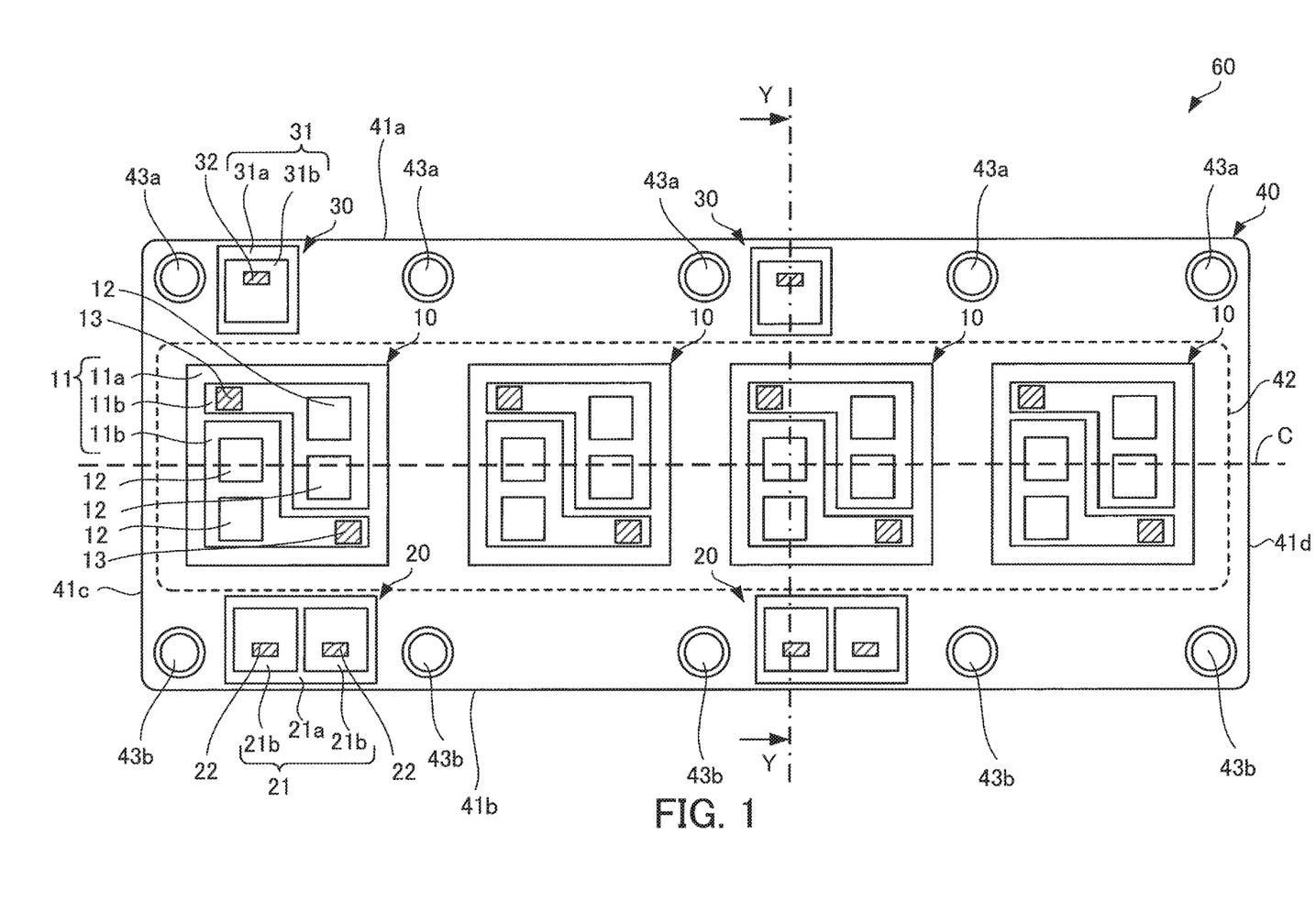
FIG. 1 is a plan view of a semiconductor device according to a first embodiment.
Figure 2A:
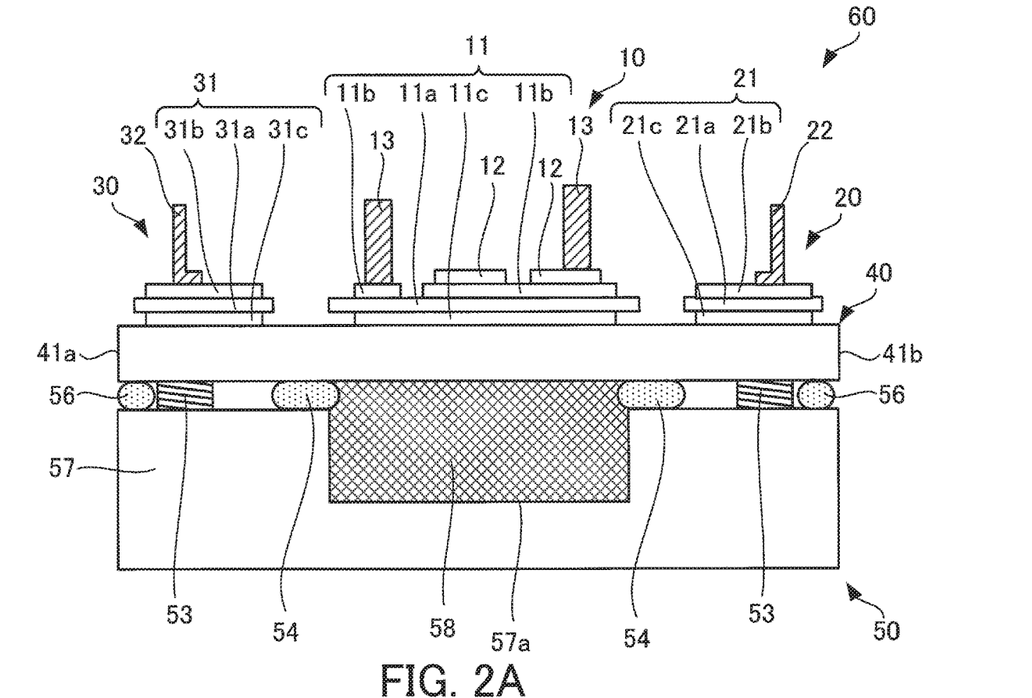
FIGS. 2A and 2B are sectional views of the semiconductor device according to the first embodiment.
Figure 2B:
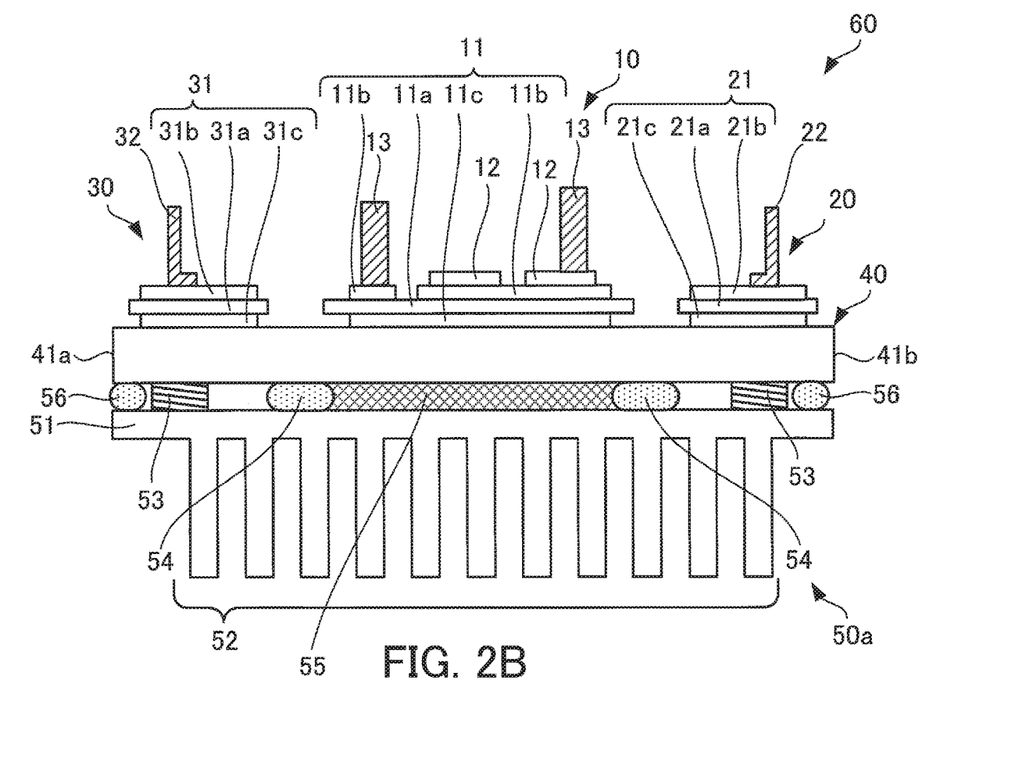

FIG. 1 is a plan view of a semiconductor device according to a first embodiment. FIGS. 2A and 2B are sectional views of the semiconductor device according to the first embodiment. FIGS. 2A and 2B are sectional views taken along the dot-dash line Y-Y of FIG. 1. Furthermore, FIG. 2A illustrates a case where a semiconductor unit 10 includes a cooler 50. FIG. 2B illustrates a case where a semiconductor unit 10 includes a heat sink 50a.

A semiconductor device 60 includes a plurality of semiconductor units 10, a plurality of connection terminal units 20, a plurality of connection terminal units 30, and a base plate 40 over whose front surface the plurality of semiconductor units 10, the plurality of connection terminal units 20, and the plurality of connection terminal units 30 are arranged. Furthermore, as illustrated in FIG. 2A, the semiconductor device 60 includes the cooler 50 located on the back surface of the base plate 40.

Each semiconductor unit 10 includes a main ceramic circuit board 11, semiconductor elements 12 bonded to the front surface of the main ceramic circuit board 11, and main terminals 13. The main ceramic circuit board 11 includes an insulating board 11a, conductive patterns 11b formed over the front surface of the insulating board 11a, and a metal plate 11c formed on the back surface of the insulating board 11a. The insulating board 11a is made of a ceramic, such as aluminum oxide, aluminum nitride, or silicon nitride, having high thermal conductivity. The thickness of the insulating board 11a is preferably greater than or equal to 0.2 mm and smaller than or equal to 1.5 mm. The thickness of the insulating board 11a is more preferably greater than or equal to 0.25 mm and smaller than or equal to 1.0 mm.

Each conductive pattern 11b is formed of a material having good conductivity. For example, copper, aluminum, or an alloy containing at least one of them is used as such a material. The thickness of each conductive pattern 11b is preferably greater than or equal to 0.1 mm and smaller than or equal to 1.0 mm. The thickness of each conductive pattern 11*b* is more preferably greater than or equal to 0.125 mm and smaller than or equal to 0.6 mm. Semiconductor elements 12 described later are bonded to each conductive pattern 11*b* with solder (not illustrated) therebetween. Not only semiconductor elements 12 but also an electronic part, such as a thermistor or a capacitor, or a wiring member, such as a bonding wire, a lead frame, or a connection terminal, may be arranged over each conductive pattern 11*b* where needed. Furthermore, plating treatment may be performed on each conductive pattern 11*b* by the use of a material having high corrosion resistance. For example, nickel, titanium, chromium, molybdenum, tantalum, niobium, tungsten, vanadium, bismuth, zirconium, hafnium, gold, silver, platinum, palladium, or an alloy containing at least one of them is used as such a material. The quantity, arrangement, and shape of the conductive patterns 11*b* are taken as an example and are not limited to the case illustrated in FIG. 1. That is to say, the quantity of the conductive patterns 11*b*, the arrangement of the conductive patterns 11*b* over the insulating board 11*a*, and the shape of the conductive patterns 11*b* may properly be determined by design. The metal plate 11*c* is made of metal, such as copper, aluminum, iron, silver, or an alloy containing at least one of them, having high thermal conductivity. The thickness of the metal plate 11*c* is preferably greater than or equal to 0.1 mm and smaller than or equal to 1.0 mm. The thickness of the metal plate 11*c* is more preferably greater than or equal to 0.125 mm and smaller than or equal to 0.6 mm.

A direct copper bonding (DCB) substrate, an active metal brazed (AMB) substrate, or the like is used as the main ceramic circuit board 11 having the above structure. The main ceramic circuit board 11 conducts heat generated by the semiconductor elements 12 to the base plate 40 via the conductive patterns 11*b*, the insulating board 11*a*, and the metal plate 11*c*. For example, the insulating board 11*a* has a rectangular shape in plan view. Furthermore, the metal plate 11*c* has a rectangular shape in plan view and the area of the metal plate 11*c* is smaller than that of the insulating board 11*a*. Accordingly, for example, the main ceramic circuit board 11 has a rectangular shape. In addition, for example, a corner of the insulating board 11*a* having a rectangular shape may be chamfered in plan view. For example, the insulating board 11*a* may have a hexagonal shape obtained by C-chamfering two corners of the rectangular shape or have an octagonal shape obtained by C-chamfering the four corners of the rectangular shape. Accordingly, for example, the main ceramic circuit board 11 has a hexagonal or octagonal shape.

The semiconductor elements 12 are arranged over the main ceramic circuit board 11. The semiconductor elements 12 include a switching element, such as an IGBT or a power MOSFET, made of silicon or silicon carbide. For example, such a semiconductor element 12 has a drain electrode (or a collector electrode) as a main electrode on the back surface, and a source electrode (or an emitter electrode) as a main electrode and a gate electrode as a control electrode on the front surface. Furthermore, the semiconductor elements 12 include a diode, such as a Schottky barrier diode (SBD) or an FWD, where needed. Such a semiconductor element 12 has a cathode electrode as a main electrode on the back surface and has an anode electrode as a main electrode on the front surface. The main terminals 13 are arranged over the main ceramic circuit board 11 and are electrically connected to the main electrodes of the semiconductor elements 12. For example, the main terminals 13 are bonded to the conductive patterns 11*b* of the main ceramic circuit board 11 over which the semiconductor elements 12 are arranged with solder therebetween.

In the first embodiment the quantities of the semiconductor elements 12 and main terminals 13 and the arrangement of the semiconductor elements 12 and main terminals 13 over the main ceramic circuit board 11 are taken as an example. The quantities of the semiconductor elements 12 and main terminals 13 and the arrangement of the semiconductor elements 12 and main terminals 13 over the main ceramic circuit board 11 may properly be determined by design. For example, the main terminals 13 may be bonded to the main electrodes of the semiconductor elements 12 with solder therebetween.

Each connection terminal unit 20 and each connection terminal unit 30 include sub-ceramic circuit boards 21 and 31 and connection terminals 22 and 32 bonded to the front surfaces of the sub-ceramic circuit boards 21 and 31, respectively. The sub-ceramic circuit boards 21 and 31 include insulating boards 21*a* and 31*a*, conductive patterns 21*b* and 31*b* formed over the front surfaces of the insulating boards 21*a* and 31*a*, and metal plates 21*c* and 31*c* formed on the back surfaces of the insulating boards 21*a* and 31*a* respectively. The structure of the sub-ceramic circuit boards 21 and 31 is the same as that of the above main ceramic circuit board 11. Accordingly, detailed descriptions of the structure of the sub-ceramic circuit boards 21 and 31 will be omitted. Furthermore, the quantities, arrangement, and shapes of the conductive patterns 21*b* and 31*b* of the sub-ceramic circuit boards 21 and 31 are taken as an example and are not limited to the case illustrated in FIG. 1. That is to say, the quantities of the conductive patterns 21*b* and 31*b*, the arrangement of the conductive patterns 21*b* and 31*b* over the insulating boards 21*a* and 31*a*, and the shapes of the conductive patterns 21*b* and 31*b* may properly be determined by design.

Each connection terminal 22 and 32 is formed of a material having good conductivity. For example, copper, aluminum, or an alloy containing at least one of them is used as such a material. The other end portion of each connection terminal 22 and 32 is bonded to a conductive pattern 21*b* or 31*b* of a sub-ceramic circuit board 21 or 31 with solder (not illustrated) therebetween. Furthermore, plating treatment may also be performed on each connection terminal 22 and 32 by the use of a material having high corrosion resistance. For example, nickel, titanium, chromium, molybdenum, tantalum, niobium, tungsten, vanadium, bismuth, zirconium, hafnium, gold, silver, platinum, palladium, or an alloy containing at least one of them is used as such a material. Each connection terminal 22 and 32 is formed "L"-shaped. The other end portion of each connection terminal 22 and 32 is bonded to a conductive pattern 21*b* or 31*b* of a sub-ceramic circuit board 21 or 31 and one end portion of each connection terminal 22 and 32 extends in a direction perpendicular to the conductive pattern 21*b* or 31*b*. However, the shape of each connection terminal 22 and 32 is taken as an example and is not limited to the case illustrated in FIG. 1. That is to say, the shape of each connection terminal 22 and 32 may properly be determined by design. For example, each connection terminal 22 and 32 may have a pin structure in the shape of a cylinder or a prism.

In addition, for example, a conductive pattern 21*b* or 31*b* of each connection terminal unit 20 and 30 and a conductive pattern 11*b* of each semiconductor unit 10 are properly connected by a wiring member (not illustrated), such as a bonding wire, in accordance with design. As a result, a connection terminal 22 or 32 and a semiconductor element 12 or the like are electrically connected. The connection terminal 22 or 32 may be a control terminal for controlling and protecting a switching element. For example, the connection terminal 22 or 32 may be a gate terminal or a sense terminal for measuring temperature, current, or voltage. Accordingly, for example, the connection terminal 22 or 32 may be electrically connected by a wiring member (not illustrated) to a control electrode such as a gate electrode or an auxiliary emitter electrode of the semiconductor element 12. Furthermore, for example, the connection terminal 22 or 32 may be electrically connected to a sense element such as a thermistor or a shunt resistor. In addition, for example, the connection terminal 22 or 32 may be electrically connected by a wiring member (not illustrated) to a signal line extending from a main electrode of the semiconductor element 12.

The base plate 40 has the shape of a rectangle having a pair of long sides 41a and 41b and a pair of short sides 41c and 41d in plan view. Furthermore, a corner of the rectangle may be chamfered. For example, a corner of the rectangle may be C-chamfered or R-chamfered. That is to say, a corner of the rectangle may be cut off straight or roundly. In addition, the number of corners to be chamfered may be one, two, three, or four where needed. The semiconductor units 10 and the connection terminal units 20 and 30 are arranged over the front surface of the base plate 40 with a bonding member (not illustrated), such as solder, therebetween. Moreover, a plurality of fixing holes 43a and a plurality of fixing holes 43b for fixing a cooling element described later are made in the base plate 40 along the pair of long sides 41a and 41b respectively. The fixing holes 43a and 43b pierce the base plate 40 in the thickness direction. For example, the base plate 40 is made of aluminum, iron, silver, copper, an alloy containing at least one of them, a composite material of aluminum and silicon carbide, or a composite material of magnesium and silicon carbide having high thermal conductivity. Furthermore, in order to improve corrosion resistance, a material, such as nickel, may be formed on the surface of the base plate 40 by plating treatment or the like. To be concrete, a nickel-phosphorus alloy, nickel-boron alloy, or the like other than nickel may be used as such a material.

The arrangement of the fixing holes 43a and 43b, the semiconductor units 10, and the connection terminal units 20 and 30 on the front surface of the base plate 40 will now be described. The plurality of fixing holes 43a are made beside the long side 41a along the long side 41a of the base plate 40. Similarly, the plurality of fixing holes 43b are made beside the long side 41b along the long side 41b of the base plate 40. It is assumed that the radii of the fixing holes 43a and 43b are r. It is desirable that the distance between the center of each fixing hole 43a or 43b and the long side 41a or 41b be longer than or equal to 1.1×r and shorter than or equal to 2.5×r. The semiconductor units 10 are formed over an arrangement area 42 of the front surface of the base plate 40 including a centerline C parallel to the pair of long sides 41a and 41b. At this time the semiconductor units 10 are formed at positions over the arrangement area 42 nearer to the centerline C than to the fixing holes 43a and 43b. For example, the four semiconductor units 10 are arranged over the arrangement area 42 in a line along the pair of long sides 41a and 41b. The quantity and arrangement of the semiconductor units 10 are taken as an example. The quantity and arrangement of the semiconductor units 10 formed over the arrangement area 42 may properly be determined by design.

The connection terminal units 20 are arranged over side portions of the front surface of the base plate 40 nearer to the long side 41b of the base plate 40 than to the arrangement area 42. Furthermore, each connection terminal unit 20 is arranged between adjacent fixing holes 43b over the front surface of the base plate 40. The connection terminal units 30 are arranged over side portions of the front surface of the base plate 40 nearer to the long side 41a of the base plate 40 than to the arrangement area 42. Furthermore, each connection terminal unit 30 is arranged between adjacent fixing holes 43a over the front surface of the base plate 40. In addition, the connection terminal units 20 and 30 are arranged outside the arrangement area 42 of the base plate 40 over which the semiconductor units 10 are arranged. The quantity and arrangement of the connection terminal units 20 illustrated in FIG. 1 are taken as an example. The quantity and arrangement of the connection terminal units 20 arranged over side portions may properly be determined by design.

As illustrated in FIG. 2A, for example, the cooler 50 is arranged as the cooling element on the back surface of the above base plate 40. The cooler 50 includes a water jacket 57 in which a refrigerant 58 flows. Furthermore, for example, the water jacket 57 is made of aluminum, iron, silver, copper, an alloy containing at least one of them, a composite material of aluminum and silicon carbide, or a composite material of magnesium and silicon carbide having high thermal conductivity. In addition, in order to improve corrosion resistance, a coating of a material, such as nickel, may be formed on the surface of the water jacket 57 by plating treatment or the like. To be concrete, a nickel-phosphorus alloy, nickel-boron alloy, or the like other than nickel may be used as such a material. For example, the water jacket 57 has the shape of a rectangular parallelepiped. An open portion 57a is formed in the water jacket 57. When the water jacket 57 is fixed onto the back surface of the base plate 40, the open portion 57a is opposed to a cooled area of the back surface of the base plate 40 corresponding to the arrangement area 42 of the base plate 40. Alignment between fixing holes (not illustrated) made in the water jacket 57 and the fixing holes 43a and 43b made in the base plate 40 is performed and the water jacket 57 is fixed onto the back surface of the base plate 40 with screws 53.

The water jacket 57 is fixed onto the back surface of the base plate 40 with a sealing member 54 therebetween. The sealing member 54 is arranged so as to surround the cooled area of the back surface of the base plate 40 corresponding to the arrangement area 42 of the front surface of the base plate 40 over which the semiconductor units 10 are arranged. Furthermore, the sealing member 54 is arranged between the cooled area of the back surface of the base plate 40 and the fixing holes 43a and 43b. In addition, elastic members 56 are arranged between the base plate 40 and the water jacket 57 outside the sealing member 54 along the long sides 41a and 41b of the base plate 40. For example, the sealing member 54 may be arranged along the long side 41a and be nearer to the centerline C than to the long side 41a. The elastic member 56 may be nearer to the long side 41a than to the centerline C. Similarly, the sealing member 54 may be arranged along the long side 41b and be nearer to the centerline C than to the long side 41b. The elastic member 56 may be nearer to the long side 41b than to the centerline C. The sealing member 54 is packing, a sealant, or the like of a rubber material or a resin material having elasticity. In order to improve a heat dissipation property, the sealing member 54 may be made of an elastic body, such as heat dissipation silicone rubber, mixed with a filler having an excellent heat dissipation property and having an insulating property. The thickness of the sealing member 54 is greater than or equal to 50 μm and smaller than or equal to 300 μm. The width of the sealing member 54 is greater than or equal to 3 mm and smaller than or equal to 7 mm. The elastic members 56 are made of a rubber material or a resin material having elasticity. Furthermore, in order to improve a heat dissipation property, the elastic members 56 may be made of an elastic body, such as heat dissipation silicone rubber, mixed with a filler having an excellent heat dissipation property and having an insulating property. The thickness of the elastic members 56 is greater than or equal to 50 μm and smaller than or equal to 300 μm. The width of the elastic members 56 is greater than or equal to 3 mm and smaller than or equal to 7 mm. In addition, an area surrounded by the sealing member 54 between the open portion 57a of the water jacket 57 fixed onto the back surface of the base plate 40 and the base plate 40 is a flow path along which the refrigerant 58 flows. The refrigerant 58 is a medium such as cooling water.

A heat sink 50a illustrated in FIG. 2B may be used as another example of the cooling element. The heat sink 50a is arranged on the back surface of the above base plate 40. The heat sink 50a includes a flat plate portion 51 and a plurality of fins 52 integrated with the flat plate portion 51. Furthermore, the heat sink 50a is also made of aluminum, iron, silver, copper, an alloy containing at least one of them, a composite material of aluminum and silicon carbide, or a composite material of magnesium and silicon carbide having high thermal conductivity. In addition, in order to improve corrosion resistance, a coating of a material, such as nickel, may be formed on the surface of the heat sink 50a by plating treatment or the like. To be concrete, a nickel-phosphorus alloy, nickel-boron alloy, or the like other than nickel may be used as such a material. The flat plate portion 51 has the shape of a flat plate. For example, the shape of the flat plate portion 51 is the same as that of the base plate 40 in plan view. Fixing holes (not illustrated) corresponding to the fixing holes 43a and 43b made in the base plate 40 are also made in the flat plate portion 51. Alignment between the fixing holes made in the flat plate portion 51 and the fixing holes 43a and 43b made in the base plate 40 is performed and the flat plate portion 51 is fixed onto the back surface of the base plate 40 with screws 53.

The flat plate portion 51 is fixed onto the back surface of the base plate 40 with a sealing member 54 therebetween. The sealing member 54 surrounds the cooled area of the back surface of the base plate 40 corresponding to the arrangement area 42 of the front surface of the base plate 40 over which the semiconductor units 10 are arranged and heat dissipation grease 55 arranged on the cooled area. Furthermore, the sealing member 54 is arranged between the cooled area of the back surface of the base plate 40 and the fixing holes 43a and 43b. In addition, elastic members 56 are arranged between the base plate 40 and the flat plate portion 51 outside the sealing member 54 along the long sides 41a and 41b of the base plate 40. For example, the sealing member 54 may be arranged along the long side 41a and be nearer to the centerline C than to the long side 41a. The elastic member 56 may be nearer to the long side 41a than to the centerline C. Similarly, the sealing member 54 may be arranged along the long side 41b and be nearer to the centerline C than to the long side 41b. The elastic member 56 may be nearer to the long side 41b than to the centerline C. The sealing member 54 is packing, a sealant, or the like of a rubber material or a resin material having elasticity. In order to improve a heat dissipation property, the sealing member 54 may be made of an elastic body, such as heat dissipation silicone rubber, mixed with a filler having an excellent heat dissipation property and having an insulating property. The thickness of the sealing member 54 is greater than or equal to 50 μm and smaller than or equal to 300 μm.

The width of the sealing member 54 is greater than or equal to 3 mm and smaller than or equal to 7 mm. The elastic members 56 are made of a rubber material or a resin material having elasticity. Furthermore, in order to improve a heat dissipation property, the elastic members 56 may be made of an elastic body, such as heat dissipation silicone rubber, mixed with a filler having an excellent heat dissipation property and having an insulating property. The thickness of the elastic members 56 is greater than or equal to 50 μm and smaller than or equal to 300 μm. The width of the elastic members 56 is greater than or equal to 3 mm and smaller than or equal to 7 mm. In addition, the heat dissipation grease 55 is surrounded by the sealing member 54 between the flat plate portion 51 and the base plate 40 and is sealed.

For example, solder used in the above semiconductor device 60 is Pb-free solder which contains at least one of a tin-silver-copper alloy, a tin-zinc-bismuth alloy, a tin-copper alloy, or a tin-silver-indium-bismuth alloy as a main ingredient. Moreover, an additive, such as nickel, germanium, cobalt, or silicon, may be contained.

The above semiconductor device 60 includes the semiconductor elements 12, the connection terminals 22 and 32, the base plate 40 which is rectangular in plan view, and the main ceramic circuit boards 11 over which the semiconductor elements 12 are arranged and which are arranged over the front surface of the base plate 40. In addition, the semiconductor device 60 includes the sub-ceramic circuit boards 21 and 31 over which the connection terminals 22 and 32, respectively, are arranged and which are arranged over the front surface of the base plate 40. Furthermore, the main ceramic circuit boards 11 are arranged over the arrangement area 42 including a central portion of the front surface of the base plate 40 along the pair of long sides 41a and 41b of the front surface of the base plate 40. The sub-ceramic circuit boards 21 and 31 are arranged over the side portions of the front surface of the base plate 40 nearer to the pair of long sides 41a and 41b of the front surface of the base plate 40 than to the arrangement area 42 of the front surface of the base plate 40. With the semiconductor device 60, the main ceramic circuit boards 11 over which the semiconductor elements 12 are arranged are separate in this way from the sub-ceramic circuit boards 21 and 31 over which the connection terminals 22 and 32, respectively, are arranged. Accordingly, heat generated by the semiconductor elements 12 is conducted via the main ceramic circuit boards 11 and the base plate 40 arranged thereunder and the sub-ceramic circuit boards 21 and 31 to the connection terminals 22 and 32. That is to say, it is difficult to conduct heat from the semiconductor elements 12 to the connection terminals 22 and 32, compared with a case where the connection terminals 22 and 32 and the semiconductor elements 12 are arranged over the same ceramic circuit board. Furthermore, the main ceramic circuit boards 11 over which the semiconductor elements 12 are arranged are arranged over the central portion of the base plate 40 and the sub-ceramic circuit boards 21 and 31 over which the connection terminals 22 and 32, respectively, are arranged are arranged over the side portions. The central portion of the base plate 40 is efficiently cooled from the back surface by the cooler 50 or the heat sink 50a. Therefore, heat conduction to the connection terminals 22 and 32 is suppressed further. If heating of the connection terminals 22 and 32 is suppressed in this way, then heating of control circuits and external devices connected to the connection terminals 22 and 32 is also suppressed. This prevents malfunction of the semiconductor device 60. In addition, the connection terminal units 20 and 30 are separate from the semiconductor units 10. The connection terminal units 20 and 30 and the semiconductor units 10 are arranged over the front surface of the base plate 40 with spaces therebetween. This relaxes distortion of the base plate 40 caused by thermal stress created by heat generated by the semiconductor elements 12 and prevents damage to the main ceramic circuit boards 11 and the sub-ceramic circuit boards 21 and 31.

Furthermore, each connection terminal unit 20 is arranged between fixing holes 43b of the front surface of the base plate 40. In addition, each connection terminal unit 30 is also arranged in the same way between fixing holes 43a of the front surface of the base plate 40. Accordingly, the connection terminal units 20 and 30 (sub-ceramic circuit boards 21 and 31) are not appreciably influenced by distortion or vibration of the base plate 40 caused by thermal deformation caused by heat generated by the semiconductor elements 12. Furthermore, the cooler 50 or the flat plate portion 51 of the heat sink 50a is fixed to the back surface of the base plate 40 with the screws 53 with the sealing member 54 and the elastic members 56 therebetween. This suppresses deformation of the base plate 40 which may occur at screwing time with the sealing member 54 as a starting point, and prevents damage to the main ceramic circuit boards 11 and the sub-ceramic circuit boards 21 and 31. In particular, the connection terminal units 20 and 30 (sub-ceramic circuit boards 21 and 31) are arranged outside a portion of the front surface of the base plate 40 corresponding to the sealing member 54. Accordingly, even if the base plate 40 deforms at screwing time with the sealing member 54 as a starting point, the sub-ceramic circuit boards 21 and 31 are not appreciably influenced by deformation of the base plate 40. This prevents damage to the sub-ceramic circuit boards 21 and 31 further. As a result, malfunction of the semiconductor device 60 is prevented, damage to the main ceramic circuit boards 11 and the sub-ceramic circuit boards 21 and 31 is prevented, and deterioration in reliability is suppressed.

Second Embodiment

A semiconductor device according to a second embodiment will be described by the use of FIG. 3 and FIGS. 4A and 4B. With a semiconductor device according to a second embodiment distortion of a base plate caused by thermal stress created by heat generated by semiconductor elements is suppressed compared with the semiconductor device 60 according to the first embodiment.

Figure 3:
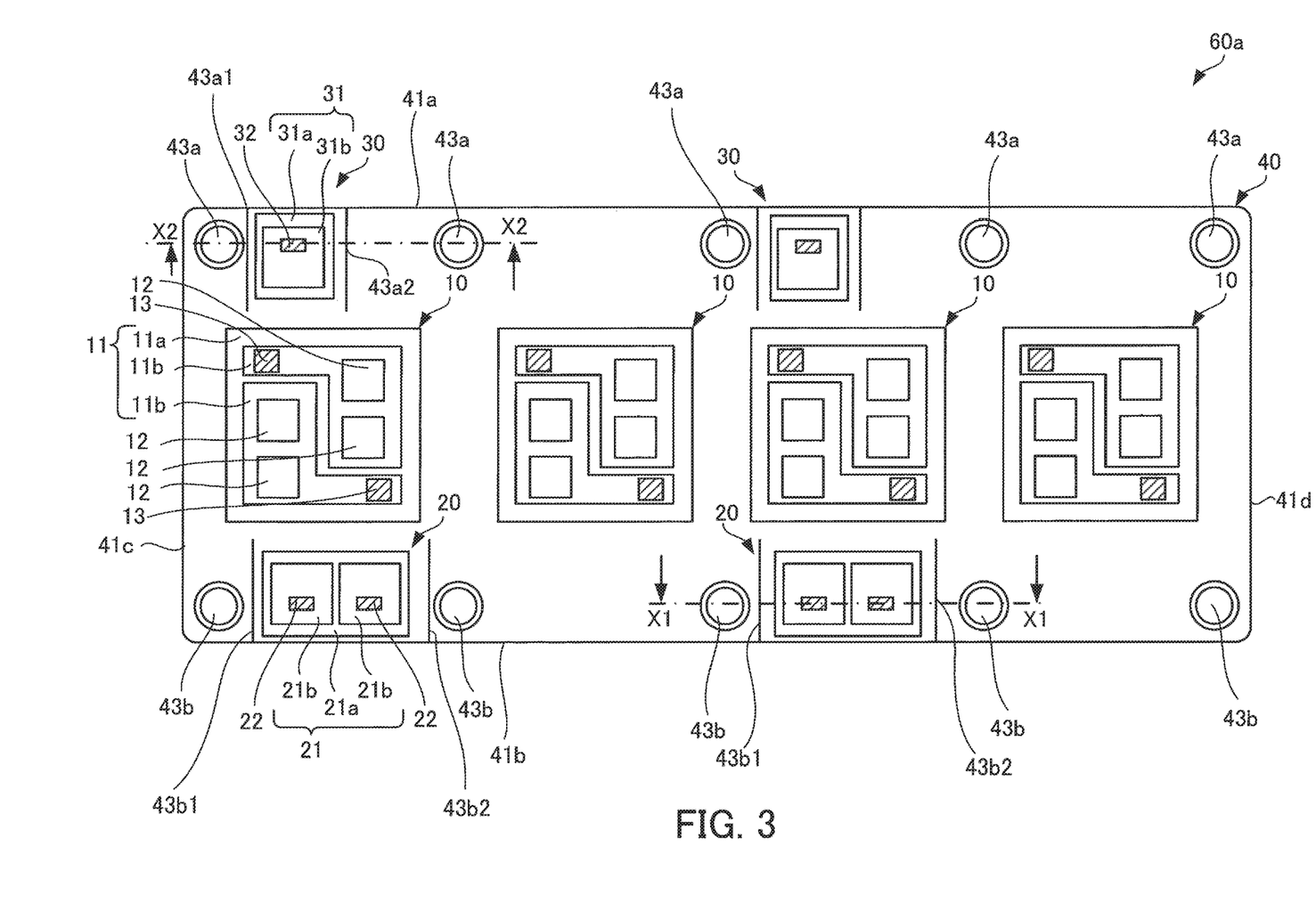
FIG. 3 is a plan view of a semiconductor device according to a second embodiment.
Figure 4A:
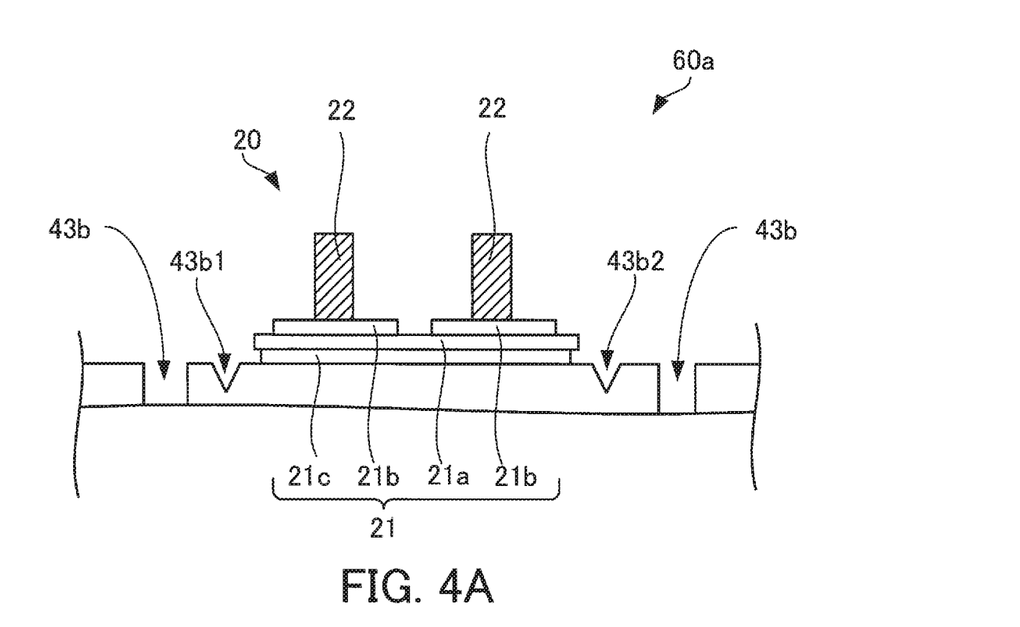
FIGS. 4A and 4B are sectional views of the semiconductor device according to the second embodiment.
Figure 4B:
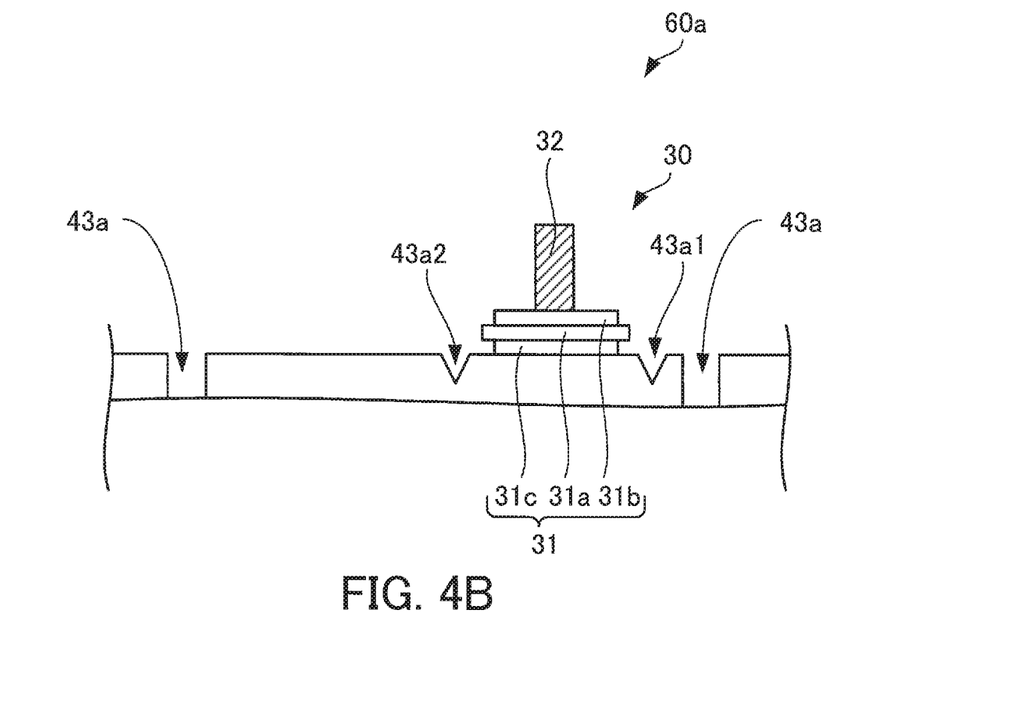

FIG. 3 is a plan view of a semiconductor device according to a second embodiment. FIGS. 4A and 4B are sectional views of the semiconductor device according to the second embodiment. FIG. 4A is a fragmentary sectional view taken along the dot-dash line X1-X1 of FIG. 3. FIG. 4B is a fragmentary sectional view taken along the dot-dash line X2-X2 of FIG. 3. If components included in a semiconductor device 60a according to the second embodiment are the same as those included in the semiconductor device 60 according to the first embodiment, then detailed descriptions of them will be omitted.

The semiconductor device 60a includes semiconductor units 10, connection terminal units 20, connection terminal units 30, a base plate 40 over whose front surface the semiconductor units 10, the connection terminal units 20, and the connection terminal units 30 are arranged, and a cooler 50 or a heat sink 50a located on the back surface of the base plate 40. This is the same with the semiconductor device 60. With the semiconductor device 60a, however, groove portions 43b1 and 43b2 are formed along short sides 41c and 41d of the base plate 40 between sub-ceramic circuit boards 21 arranged over the base plate 40 and fixing holes 43b adjacent thereto. Furthermore, with the semiconductor device 60a groove portions 43a1 and 43a2 are formed along the short sides 41c and 41d of the base plate 40 between sub-ceramic circuit boards 31 arranged over the base plate 40 and fixing holes 43a adjacent thereto. The depth of the groove portions 43a1, 43a2, 43b1, and 43b2 is greater than or equal to 50 μm and smaller than or equal to 500 μm. Furthermore, in FIGS. 4A and 4B, a section of each groove portion 43a1, 43a2, 43b1, or 43b2 has the shape of an inverted triangle. However, a section of each groove portion 43a1, 43a2, 43b1, or 43b2 may have the shape of a square, a semicircle, or the like.

Therefore, in addition to the components included in the semiconductor device 60, the above semiconductor device 60a includes the groove portions 43b1 and 43b2 formed in a direction parallel to the short sides of the base plate 40 between the sub-ceramic circuit boards 21 arranged over the base plate 40 and the fixing holes 43b adjacent thereto. In addition, the semiconductor device 60a includes the groove portions 43a1 and 43a2 formed in the direction parallel to the short sides of the base plate 40 between the sub-ceramic circuit boards 31 arranged over the base plate 40 and the fixing holes 43a adjacent thereto. This relaxes distortion of the base plate 40 caused by thermal stress created by heat generated by semiconductor elements 12 and also relaxes stress applied to the sub-ceramic circuit boards 21 and 31. Accordingly, with the semiconductor device 60a damage to the sub-ceramic circuit boards 21 and 31 is prevented further compared with the semiconductor device 60.

With the semiconductor device having the above structure, heating of connection terminals is suppressed. As a result, deterioration in the reliability of the semiconductor device is suppressed.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device, comprising:
   a semiconductor element;
   a connection terminal;
   a base plate having in a plan view a rectangular shape with two long sides and two short sides;
   a main substrate on which the semiconductor element is disposed, the main substrate being disposed on a front surface of the base plate;
   a sub-substrate on which the connection terminal is disposed, the sub-substrate being disposed on the front surface of the base plate; and
   a sense element, wherein
   the main substrate is disposed in an arrangement area of the front surface of the base plate, the arrangement area being located between the two long sides of the base plate and including a center line passing through a center of the front surface of the base plate in a direction parallel to the two long sides of the base plate, the main substrate being disposed across the center line, the sub-substrate is disposed on the front surface at a periphery of the base plate between one of the two long sides of the base plate and the arrangement area so as to be positioned closer to the one of the two long sides than to the arrangement area, the semiconductor element includes a main electrode and a control electrode, the main substrate includes a main terminal that is electrically connected to the main electrode of the semiconductor element, and the connection terminal is a control terminal that is electrically connected to the control electrode of the semiconductor element or a sense terminal that is electrically connected to the sense element.

2. The semiconductor device according to claim 1, wherein the main substrate is provided in plurality, and the plurality of main substrates are each disposed across the center line of the front surface of the base plate and are arranged in a single line.

3. A semiconductor device, comprising:

a semiconductor element;

a connection terminal;

a base plate having in a plan view a rectangular shape with two long sides and two short sides;

a main substrate on which the semiconductor element is disposed, the main substrate being disposed on a front surface of the base plate;

a sub-substrate on which the connection terminal is disposed, the sub-substrate being disposed on the front surface of the base plate;

a cooling element fixed to a back surface of the base plate opposite to the front surface of the base plate, the base plate having a cooled area located on the back surface at an area corresponding to the arrangement area of the base plate; and a sealing member disposed so as to surround the cooled area, between the back surface of the base plate and the cooling element, wherein the main substrate is disposed in an arrangement area of the front surface of the base plate, the arrangement area being located between the two long sides of the base plate and including a center line passing through a center of the front surface of the base plate in a direction parallel to the two long sides of the base plate, the main substrate being disposed across the center line, the sub-substrate is disposed on the front surface at a periphery of the base plate between one of the two long sides of the base plate and the arrangement area so as to be positioned closer to the one of the two long sides than to the arrangement area, the main substrate in the plan view has a rectangular shape, the sealing member has two side parts, each of which in the plan view respectively corresponds to a respective one of two sides of the main substrate in a direction parallel to the two long sides of the base plate, and is disposed along the respective one of the two sides of the main substrate, and the plurality of fixing holes are positioned in the base plate further from the cooled area than is the sealing member.

4. The semiconductor device according to claim 3, further comprising a plurality of elastic members disposed between the back surface of the base plate and the cooling element, each of the plurality of elastic members being positioned further from the base plate than is the sealing member.

5. The semiconductor device according to claim 3, further comprising a plurality of elastic members disposed between the back surface of the base plate and the cooling element, wherein the sealing member extends along the one of the two long sides, closer to the cooled area than are the plurality of fixing holes of the base plate, and the elastic members are disposed closer to the one of the two long sides than are the plurality of fixing holes of the base plate.

6. The semiconductor device according to claim 3, wherein the base plate has a groove extending in the direction of the two short sides of the base plate, the groove being located between the sub-substrate and a fixing hole that is the closest to the sub-substrate among the plurality of fixing holes.

7. The semiconductor device according to claim 3, wherein the main substrate and the sealing member each are provided in plurality, and a plurality of the sealing members are disposed along the two sides of each of the plurality of main substrates in the direction parallel to the two long sides of the base plate.

* * * * *